(12) United States Patent
Penney (10) Patent No.: US 7,512,019 B2
(45) Date of Patent: Mar. 31, 2009

(54) HIGH SPEED DIGITAL SIGNAL INPUT BUFFER AND METHOD USING PULSED POSITIVE FEEDBACK

(75) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 255 days.

(21) Appl. No.: 11/266,622

(22) Filed: Nov. 2, 2005

(65) Prior Publication Data

US 2007/0097752 A1    May 3, 2007

(51) Int. Cl.
G11C 7/10 (2006.01)
(52) U.S. Cl. .................. 365/189.05; 365/207; 365/190
(58) Field of Classification Search ............ 365/189.05, 365/207, 190
See application file for complete search history.

(56) References Cited

U.S. PATENT DOCUMENTS

| | | | |
|---|---|---|---|
| 4,041,333 A | 8/1977 | Porat | 307/279 |
| 4,071,784 A | 1/1978 | Maeder et al. | 307/279 |
| 4,553,051 A | 11/1985 | Prater | 307/475 |
| 4,555,642 A | 11/1985 | Morales | 307/475 |
| 4,612,461 A | 9/1986 | Sood | 307/475 |
| 4,807,198 A | 2/1989 | Flannagan et al. | 365/230 |
| 5,157,277 A | 10/1992 | Tran et al. | 307/269 |
| 5,341,037 A | 8/1994 | Miki et al. | 307/352 |
| 5,469,402 A | 11/1995 | Yamauchi et al. | 365/230.08 |
| 5,471,150 A | 11/1995 | Jung et al. | 326/87 |
| 5,619,151 A | 4/1997 | Akioka et al. | 327/78 |
| 5,680,066 A | 10/1997 | Akioka et al. | 327/78 |
| 5,734,920 A | 3/1998 | Gotoh et al. | 395/800 |
| 5,751,166 A | 5/1998 | Shieh et al. | 326/71 |
| 5,841,309 A | 11/1998 | Bonaccio et al. | 327/333 |
| 5,862,390 A | 1/1999 | Ranjan | 395/750.01 |
| 5,872,736 A | 2/1999 | Keeth | 365/189.05 |
| 5,910,920 A | 6/1999 | Keeth | 365/189.05 |
| 5,917,758 A | 6/1999 | Keeth | 365/189.05 |
| 6,023,174 A | 2/2000 | Kirsch | 326/34 |
| 6,023,181 A | 2/2000 | Penny et al. | 327/291 |
| 6,124,748 A * | 9/2000 | Jacobs | 327/379 |
| 6,138,255 A | 10/2000 | Noji | 714/719 |
| 6,198,306 B1 | 3/2001 | Sessions | 326/83 |
| 6,259,280 B1 | 7/2001 | Koelling | 327/53 |
| 6,288,590 B1 | 9/2001 | Sandhu | 327/318 |
| 6,326,810 B1 | 12/2001 | Keeth | 326/83 |
| 6,335,633 B1 | 1/2002 | Kirsch | 326/34 |
| 6,407,588 B1 | 6/2002 | Baker | 327/55 |
| 6,429,710 B1 | 8/2002 | Ting et al. | 327/206 |
| 6,430,717 B1 | 8/2002 | Noji | 714/718 |

(Continued)

*Primary Examiner*—Huan Hoang
*Assistant Examiner*—Kretelia Graham
(74) *Attorney, Agent, or Firm*—Dorsey & Whitney LLP (57) ABSTRACT

An input buffer generates an output signal corresponding to a digital input signal. The input buffer is coupled to a feedback circuit. The feedback circuit initially couples a positive feedback signal to the buffer circuit responsive to each transition of the input signal. The positive feedback signal increases the gain of the input buffer thereby causing the input buffer to transition the output signal more quickly in response to the transition of the input signal. The feedback circuit thereafter terminates the positive feedback signal before a subsequent transition of the input signal. The positive feedback signal is generated by detecting a transition of the output signal responsive to the transition of the input signal that initiated the positive feedback signal.

38 Claims, 6 Drawing Sheets

U.S. PATENT DOCUMENTS

| | | | |
|---|---|---|---|
| 6,437,600 B1 | 8/2002 | Keeth | 326/86 |
| 6,452,429 B1 | 9/2002 | Lim | 327/108 |
| 6,456,122 B1 | 9/2002 | Park et al. | 327/55 |
| 6,501,318 B1 | 12/2002 | Randazzo et al. | 327/309 |
| 6,538,473 B2 * | 3/2003 | Baker | 326/82 |
| 6,600,343 B2 | 7/2003 | Baker | 327/55 |
| 6,633,191 B2 | 10/2003 | Hu | 327/323 |
| 6,750,684 B2 | 6/2004 | Lim | 327/108 |
| 6,825,698 B2 | 11/2004 | Wang et al. | 327/108 |
| 6,914,454 B2 | 7/2005 | Baker | 327/55 |
| 7,088,140 B1 | 8/2006 | Nguyen et al. | 326/81 |
| 7,116,135 B2 | 10/2006 | Wang et al. | 327/108 |
| 2002/0011877 A1 | 1/2002 | Lim | 327/77 |
| 2002/0021149 A1 | 2/2002 | Park et al. | 327/87 |
| 2002/0105369 A1 | 8/2002 | Hu | 327/323 |
| 2002/0118043 A1 | 8/2002 | Enam et al. | 326/89 |
| 2002/0118592 A1 | 8/2002 | Wright et al. | 365/233 |
| 2002/0140461 A1 | 10/2002 | Enam et al. | 327/65 |
| 2003/0067328 A1 | 4/2003 | Wright et al. | 327/108 |
| 2003/0090287 A1 | 5/2003 | Zivanovic | 324/765 |
| 2004/0027178 A1 | 2/2004 | Chae et al. | 327/112 |
| 2005/0083124 A1 | 4/2005 | Dawes | 330/253 |
| 2005/0168246 A1 | 8/2005 | Sharma et al. | 327/78 |
| 2005/0253629 A1 | 11/2005 | Zivanovic | 327/108 |
| 2006/0012408 A1 | 1/2006 | Kushner | 327/112 |

* cited by examiner

HIGH SPEED DIGITAL SIGNAL INPUT BUFFER AND METHOD USING PULSED POSITIVE FEEDBACK

TECHNICAL FIELD

This invention relates to digital circuits, and, more particularly, to input buffers for high frequency digital signals applied to electronic circuits, such as memory devices, that must be coupled to internal circuits with minimal delay.

BACKGROUND OF THE INVENTION

Input buffers are commonly used in a wide variety of digital integrated circuits. For example, input buffers are commonly used to couple command signals, address signals, write data signals and clock signals from externally accessible terminals to internal circuits of integrated circuit memory devices such as dynamic random access memory ("DRAM") devices.

Figure 1:
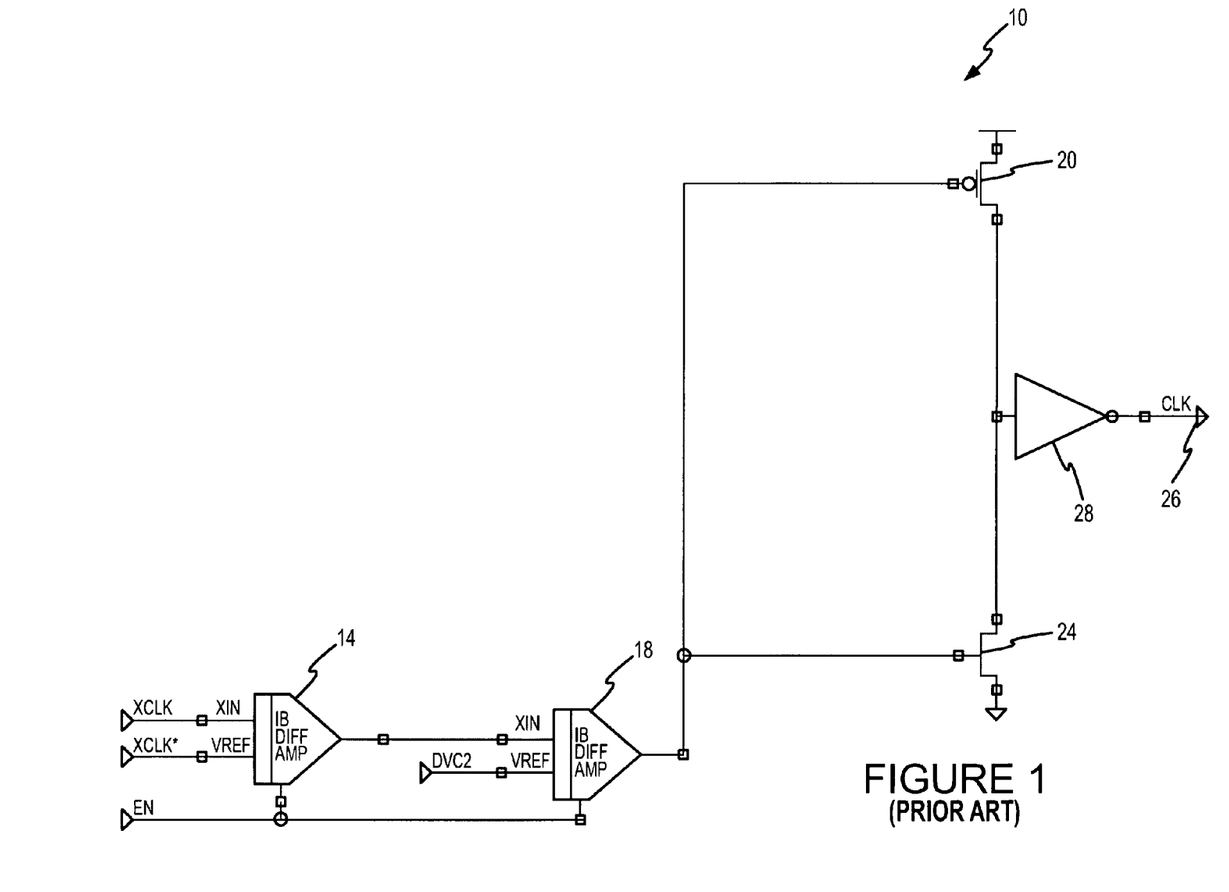
FIG. 1 is a logic diagram and schematic diagram of a typical input buffer of conventional design.

A typical input buffer 10 used in integrated circuits such as memory devices is shown in FIG. 1. The input buffer 10 includes a first inverting buffer circuit 14 receiving complementary external clock signals XCLK and XCLK*. The buffer circuit 14 outputs a digital signal having a logic level depending upon the polarity of a comparison between the XCLK and XCLK* signals. An output of the buffer circuit 14 is applied to an input of a second inverting buffer circuit 18, which provides additional gain for the XCLK and XCLK* signals. Another input of the buffer circuit 18 receives a DVC2 signal, which generally has a magnitude equal to one-half of a power supply voltage $V_{CC}$ applied to the buffer circuits 14, 18. In such cases, the logic levels output by the buffer circuits 14, 18 generally transition between zero volts and the power supply voltage $V_{CC}$. The buffer circuits 14, 18 may also be selectively enabled by an enable signal EN applied to respective enable inputs of the amplifiers 14, 18.

The output of the buffer circuit 18 is applied to the gate of a PMOS transistor 20 and the gate of an NMOS transistor 24. The source of the PMOS transistor 20 receives a supply voltage $V_{CC}$, while the source of the NMOS transistor 24 is connected to ground. The drains of the transistors 20, 24 are connected to each other and to an output terminal 26 through an inverter 28.

In operation, when the magnitude of the XCLK signal is greater than the magnitude of the XCLK*signal, the buffer circuit 14 outputs a low logic level, and the buffer circuit 18 outputs a high logic level. This high logic level turns OFF the PMOS transistor 20 and turns ON the NMOS transistor 24, thereby pulling in the input of the inverter 28 to ground. A high logic level is therefore produced at the output terminal 26.

When the magnitude of the XCLK signal is less than the magnitude of the XCLK*signal, the buffer circuit 14 outputs a high logic level, and the buffer circuit 18 outputs a low logic level. This low logic level turns ON the PMOS transistor 20 and turns OFF the NMOS transistor 24, thereby driving the input of the inverter 28 to the supply voltage $V_{CC}$. The inverter 28 then outputs a low logic level at the output terminal 26.

Input buffers, including the input buffer 10 shown in FIG. 1, generally perform a number of advantageous functions. Input buffers generally provide a high input impedance to avoid unduly loading signal lines coupled to their inputs. They also condition signals applied to internal circuits so that internal signals have well defined logic levels and transition characteristics. Other advantages of input buffers are also well-known to one skilled in the art.

Although input buffers can provide a number of advantages, they are not without some disadvantages and limitations. For example, the time required to couple signals through input buffers can greatly increase the time required to couple externally applied digital signals to circuits within an integrated circuit. For example, each of the buffer circuits 14, 18 can significantly delay the propagation of digital signals coupled from their inputs to their outputs. This delay primarily results from capacitances inside the buffer circuits 14, 18. The digital signals also can be delayed in being coupled to the transistors 20, 24. This delay is primarily due to the time required for the digital signals to propagate through signal lines from the output of the buffer circuit 18 to the gates of the transistors 20, 24, which is affected by the length of the signal lines and their capacitances. Further delay can be encountered in the transistors 20, 24 and the inverter, which are again primarily due to be internal circuit capacitances in those devices.

The delays in coupling digital signals through input buffers, such as the input buffer 10, can significantly reduce the operating speed of integrated circuits, such as memory devices, using such input buffers. These delays become even more problematic as the operating speeds of integrated circuits continue to increase.

Various approaches have been used to increase the operating speed of input buffers. One approach relies on coupling positive feedback from downstream circuitry in the input buffer to upstream circuitry of the input buffer, such as its input. As it is well-known in the art, positive feedback increases the gain of the input buffer thereby causing the output signal to more quickly transition in response to a transition of an input signal. However, the amount of positive feedback must be relatively weak or else the input buffer will be bi-stable, i.e., the output signal may be latched at either of the two logic levels of the output signal regardless of the logic level of the input signal. While it might be possible to overcome this strong positive feedback, the need to drive the output signal with sufficient strength to overcome the positive feedback can itself result in significant delays. Furthermore, when the output is latched to a logic level that does not correspond to the logic level of the input signal, the positive feedback in effect becomes negative feedback and is therefore counterproductive and causing the output of the buffer to transition to the new logic level.

There is therefore a need for a digital signal input buffer and method that can couple digital signals from externally accessible terminals to internal circuitry with a minimum of propagation delay.

SUMMARY OF THE INVENTION

An digital signal input buffer and method operates at a relatively high speed by providing positive feedback to the input buffer responsive to each transition of the input signal. The positive input is provided for a period that terminates substantially before the next transition of the input signal, but preferably until the occurrence of a transition of an output signal responsive to the transition of the input signal. In such case, the output signal is coupled through a delay circuit to terminate the positive feedback.

DETAILED DESCRIPTION OF THE INVENTION

Figure 2:
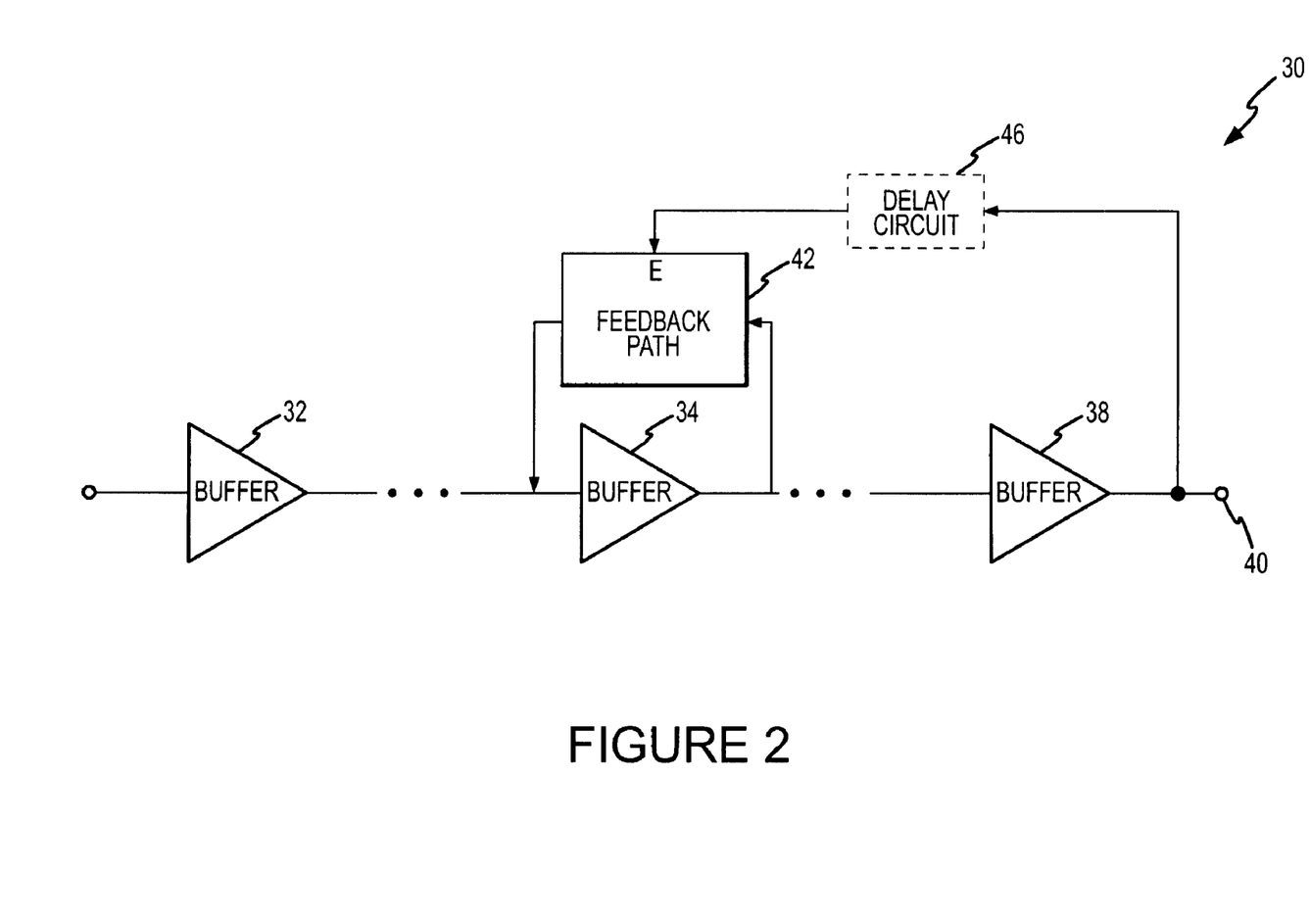
FIG. 2 is a block diagram of an input buffer according to one example of the invention.

An input buffer 30 according to one example of the invention is shown in FIG. 2. The input buffer 30 receives an input signal at an input to a buffer circuit 32. A signal at an output of the buffer circuit 32 is applied to an input of a second buffer circuit 34 either directly or through intervening circuitry. Similarly, an output of the buffer circuit 34 is applied to an input of a third buffer circuit 38, again either directly or through intervening circuitry. An output of the third buffer circuit 38 is coupled to an output terminal 40 of the input buffer 30. The buffer circuits 32, 34, 38 may be inverting or non-inverting, and they may be any conventional or hereinafter buffer circuit or other circuitry for coupling digital signals.

The input buffer 30 also includes a feedback path 42 that, when enabled, couples positive feedback from a downstream circuit node, such as the output of the buffer circuit 34, to a downstream circuit node, such as the input of the buffer circuit 34. However, it will be understood that the feedback path 42 can couple positive feedback from other downstream circuit nodes, including the output terminal 40, to other upstream circuit nodes, including the input to the buffer circuit 32.

The feedback path 42 is selectively enabled by a signal applied to its enable "E" the input from a downstream circuit node, such as the output of the buffer circuit 38 as shown in FIG. 2. The enable signal may be applied to the enable input of the feedback path 42 either directly or, optionally, through a delay circuit 46.

In operation, a transition of a digital signal applied to the input of the buffer circuit 32 results in a transition of a digital signal at the output of the buffer circuit 34. This transition of the digital signal is coupled through the feedback path 42 to the input of the buffer circuit 34 as positive feedback. The positive feedback increases the gain of the buffer circuit 34 to cause the signal at the output of the buffer circuit 34 to more quickly transition. In fact, the positive feedback can be so strong that the output of the buffer circuit 34 would be latched to whatever logic level it was driven despite subsequent transitions in the digital signal applied to the input of the buffer circuit 32. To prevent the output of the buffer circuit 34 from becoming the latched at one logic level, the output of the buffer circuit 38 is used to disable the feedback path 42 when the signal at the output of the buffer circuit 38 transitions responsive to a transition of the digital signal applied to the input of the buffer circuit 32. If desired, the delay circuit 46 can be used to maintain the positive feedback present for a longer period of time after the output of the input buffer 30 has transitioned. Continuing the positive feedback for a longer period allows signal perturbations in the input buffer 30 to more quickly settle. However, the delay circuit 46 is not absolutely necessary since the output of the input buffer 30 would still have transitioned to the new logic level before the positive feedback was discontinued. In any case, by disabling the positive feedback, the output of the buffer circuit 34 can be easily switched back to the original logic level since no latching at the output of the buffer circuit 34 occurs.

Figure 3:
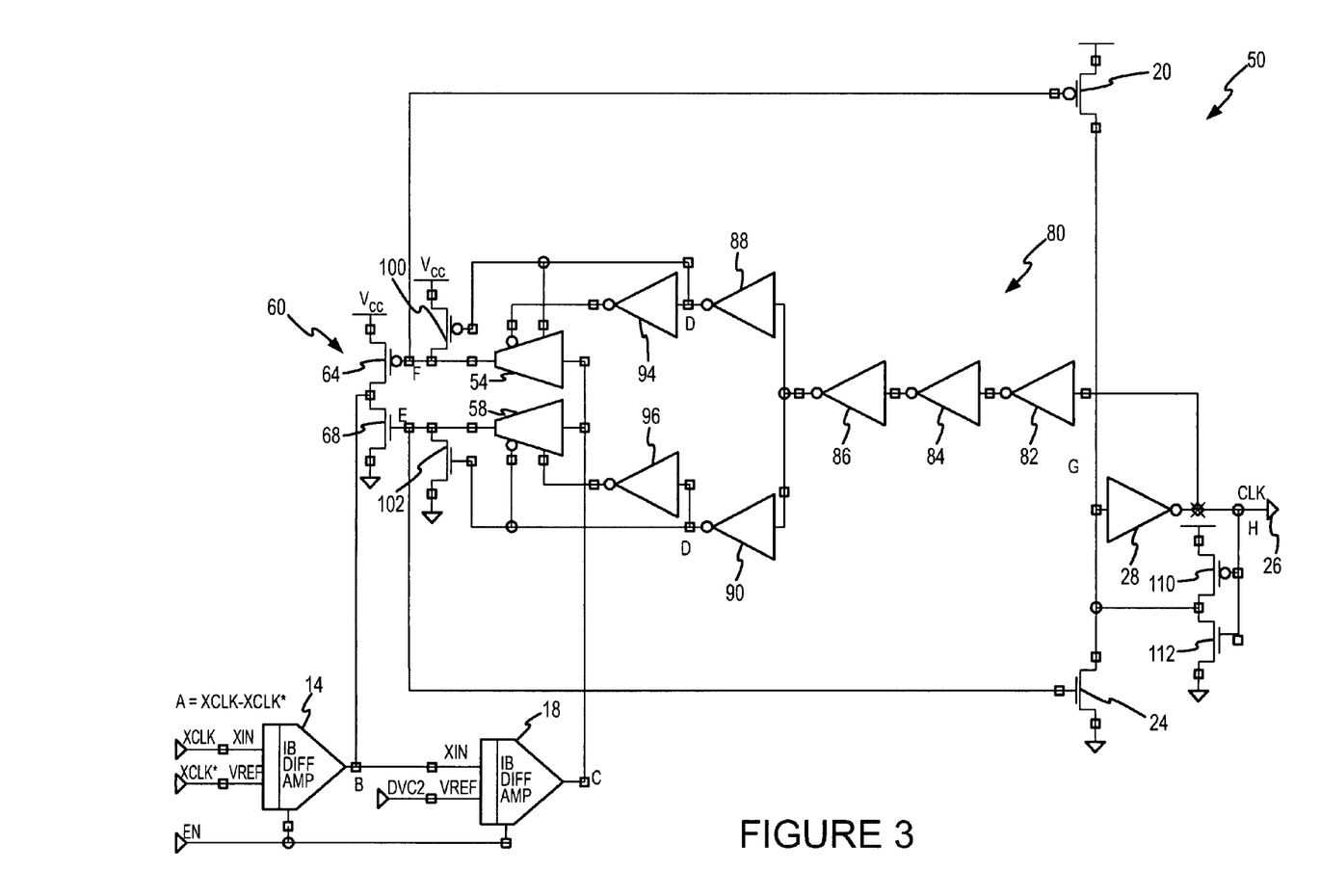
FIG. 3 is a logic diagram and schematic diagram of an input buffer according to another example of the invention.

An input buffer 50 showing one example of the input buffer 30 of the present invention is shown in FIG. 3. The input buffer 50 includes all of the components of a used in the input buffer 10 shown in FIG. 1 operating in substantially the same manner. (The reference letters shown in FIG. 3 are used to identify circuit nodes, and will be reference to the timing diagram of FIG. 4). Therefore, these components have been provided with the same reference numerals, and the description of their operation will not be repeated. However, rather than applying the output of the buffer circuit 18 directly to the gates of the transistors 20, 24, the output of the buffer circuit 18 and is applied to the gates of the transistors 20, 24 through respective pass gates 54, 58.

The input buffer 50 also includes a feedback path 60 coupling the output of the pass gates 54, 58 to the input of the buffer circuit 18. When the output of the buffer circuit 18 is low and is coupled through the pass gate 54, a PMOS transistor 64 is turned ON to couple the supply voltage $V_{cc}$ to the input of the buffer circuit 18 as positive feedback. The positive feedback applied to the input of the buffer circuit 18 is thus the complement of the signal at the output of the buffer circuit 18. The transistor 64 is able to very quickly drive the input of the buffer circuit 18 high even if the input of the buffer circuit 18 is highly capacitive. Similarly, when the output of the buffer circuit 18 is high and is coupled through the pass gate 58, an NMOS transistor 68 is turned ON to couple the input of the buffer circuit 18 to ground as positive feedback. Again, the transistor 68 is able to very quickly drive the input of the buffer circuit 18 low even if the input of the buffer circuit 18 is highly capacitive. As a result, when the pass gates 54, 58 are conductive, positive feedback is coupled from the output of the buffer circuit 18 to its input.

The output of the pass gates 54, 58 are also coupled to the gates of the transistors 20, 24, respectively, to drive the output terminal 26 of the input buffer 50 through the inverter 28. Thus, when the magnitude of the XCLK signal is greater than the magnitude of the XCLK*signal, which corresponds to a high logic level, the buffer circuit 18 outputs a high logic level. The high logic level at the output of the buffer circuit 18 turns ON the NMOS transistor 24 thereby driving the input of the inverter 28 low and the output of the inverter 28 high. The input buffer 50 thus outputs a high logic level. When the magnitude of the XCLK signal is less than the magnitude of the XCLK*signal, which corresponds to a low logic level, the buffer circuit 18 outputs a low logic level. The low logic level at the output of the buffer circuit 18 turns ON the PMOS transistor 20 thereby driving the input of the inverter 28 high and the output of the inverter 28 low. The input buffer 50 thus outputs a low logic level.

The conductive states of the pass gates 54, 58 are controlled by a delay circuit 80 formed by a series of inverters 82, 84, 86, 88, 90 coupled between the output of the inverter 28 and the pass gates 54, 58. Additional inverters 94, 96 are used to provide complements of the signals at the outputs of the inverters 88, 90, respectively. However, the output of the inverters 88, 94 are connected to the pass gates 54 differently from the manner in which the inverters 90, 96 are connected to the pass gate. 58. The pass gate 54 is conductive when the output of the inverter 94 is low whereas the pass the 58 it is conductive when the output of the inverter 96 is high. As result, the pass gates 54, 58 are alternately conductive. The pass gate 54 becomes conductive a short time after the signal at the output terminal 26 transitions high, and the pass gate 58 becomes conductive a short time after the signal at the output terminal 26 transitions low.

The output of the inverter 88 is also applied to the gate of a PMOS transistor 100 that selectively couples the supply voltage Vcc to the gate of the transistor 64 to turn OFF the transistor 64. When the output of the inverter 88 transitions low, the transistor 100 is turned ON to turn OFF the transistor 64 and discontinue a high feedback voltage provided to the input of the buffer circuit 18. Therefore, a short time after the voltage at the output terminal 26 transitions low responsive to a high applied to the input of the buffer circuit 18, the transistor 64 is turned OFF to remove the supply voltage $V_{CC}$ from the input to the buffer circuit 18.

In a similar manner, the output of the inverter 90 is applied to the gate of an NMOS transistor 102 that selectively couples the gate of the transistor 68 to ground, thereby turning OFF the transistor 68. When the output of the inverter 90 transitions high, the transistor 102 is turned ON to turn OFF the transistor 68 and discontinue a low feedback voltage provided to the input of the buffer circuit 18. Therefore, a short time after the voltage at the output terminal 26 transitions high responsive to a low applied to the input of the buffer circuit 18, the transistor 68 is turned OFF to remove the ground from the input to the buffer circuit 18.

Figure 4:
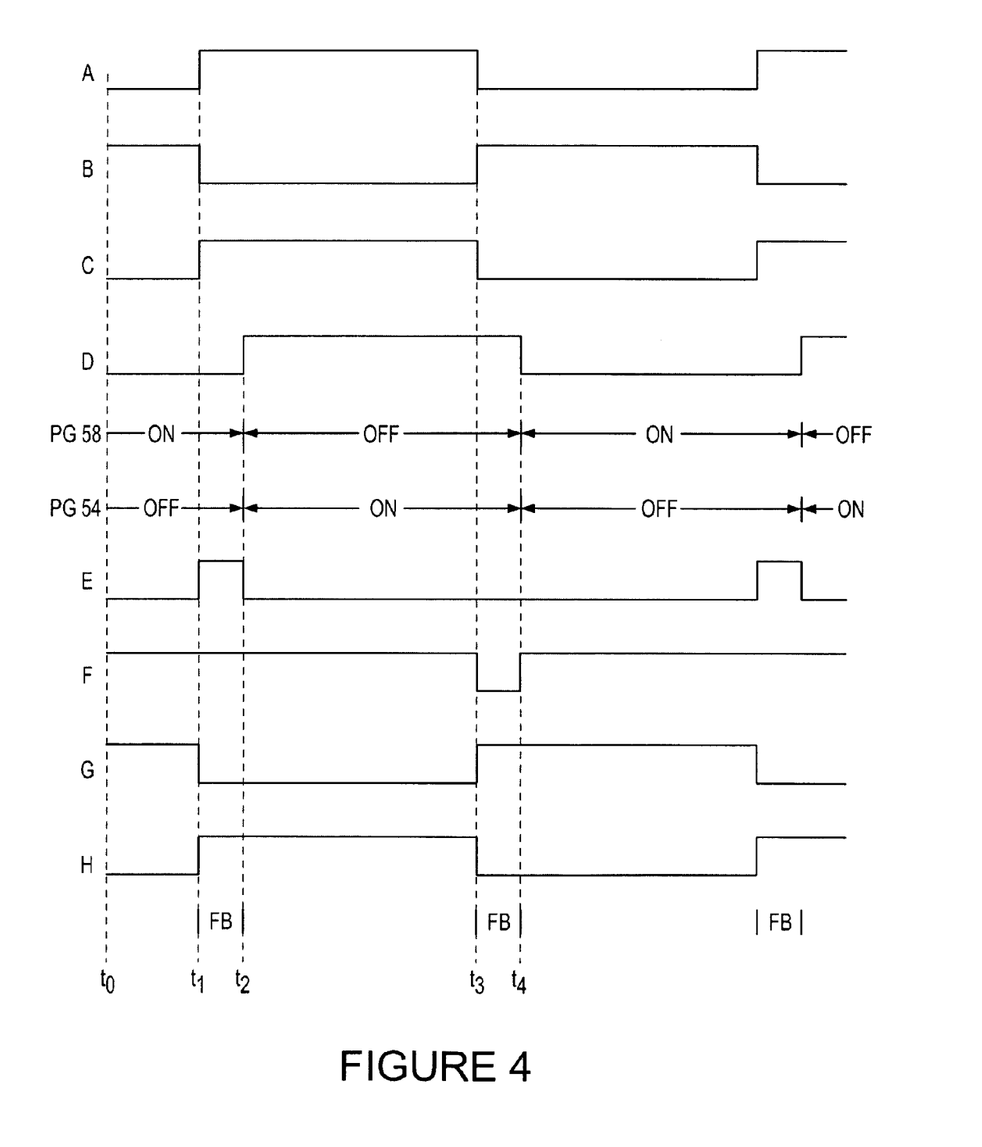
FIG. 4 is a timing diagram showing the signals present in the input buffer of FIG. 3.

The overall operation of the input buffer 50 will now be explained with reference also to the timing diagram shown in FIG. 4 in which each signal is labeled with a letter that identifies the circuit node in FIG. 3 on which the signal is present. The circuit nodes are initially presumed to be at the voltages shown in FIG. 4 at time $t_0$ in which the input ("A") to the buffer 50 is low thereby making the output ("H") from the buffer 50 low. At time $t_1$, the input ("A") transitions high thereby causing the buffer circuit 14 to output a low ("B") and the buffer circuit 18 to output a high ("C"). Insofar as the output ("H") is low prior to time $t_1$, the pass gate 58 is conductive at time $t_1$. The high at the output of the buffer circuit 18 is therefore coupled through the pass gate 58 ("E") to turn ON the NMOS transistor 68. The transistor 68 then grounds the input to the buffer circuit 18, thereby providing positive feedback.

The high coupled through the pass gate 58 ("E") is also applied to the NMOS transistor 24, thereby driving the input to the inverter 28 low and the voltage at the output terminal 26 high. Thus, the output terminal 26 is quickly driven high responsive to the transition of the input signal ("A") from low to high.

The high at the output of the inverter 28 is then coupled through the inverters 82-90 so that the output of the inverter 90 ("D") transitions high after a short delay at time $t_2$. The pass gate 58 then becomes nonconductive to decouple the output of the buffer circuit 18 from the gates of the transistor 68, 24. At the same time, the high at the output of the inverter 90 turns ON the transistor 102, which drives the gates of the transistors 68, 24 low ("E") to turn OFF the transistors 68, 24. Turning OFF the transistor 68 removes the positive feedback applied to the input of the buffer circuit 18. Therefore, the positive feedback is present at the input to the buffer circuit 18 only between $t_1$ and $t_2$, as indicated by the label "FB" at the bottom of FIG. 4. Turning OFF the transistor 24 allows the input to the inverter 28 to float. For this reason, weak positive feedback is provided to the input of the inverter 28 from its output using a PMOS transistor 110 and an NMOS transistor 112 connected to each other as an inverter. The high at the output of the inverter 28 turns ON the transistor 112 to hold the input of the inverter 28 low ("G") when the transistor 24 is turned OFF at time $t_2$.

The low to high transition at the output of the buffer circuit 18 at time $t_1$ is also applied to the input of the pass gate 54. However, since the pass gate is nonconductive at that time, the high logic level has no effect on any of the circuits coupled to the output of the pass gate 54. When the pass gate 54 becomes conductive at time $t_2$, the high ("C") at the output of the buffer circuit 18 is coupled to both the gate of the transistor 64 and the gate of the transistor 20. However, this high simply turns OFF the transistors 64, 20. Further, the high at the output of the inverter 88 ("D") starting at time $t_2$ turns ON the transistor 100 to also hold the gates of the transistors 64, 20 high.

The input buffer 50 remains stable in the condition explained above until time $t_3$ when the input signal ("A") transitions low. Since the high at the output terminal 26 ("H") makes the pass gate 54 conductive, the low at the output of the buffer circuit 18 ("C") is applied to the gates of the transistors 64, 20 at time $t_3$. The transistor 64 then turns ON to apply the supply voltage $V_{CC}$ to the input of the buffer circuit 18 as positive feedback. At the same time, the low ("F") at the output of the pass gate 54 turns ON the transistor 20 to drive the input of the inverter 28 high ("G") and its output low ("H"). Therefore, the output of the buffer 50 transitions low at time $t_3$ responsive to the input to the buffer 50 transitioning low.

The high to low transition at the output of the inverter 28 is coupled through the inverters 82-88 at time $t_4$ thereby causing the output of the inverter 88 to transition low ("D"). This low renders the pass gate 54 nonconductive to isolate the low at the output of the buffer circuit 18 from the transistors 64, 20. The low at the output of the inverter 88 ("D") also turns ON the transistor 100, which drives the output of the pass gate 54 high ("F"). This high turns OFF the transistor 64 to terminate the positive feedback. Turning ON the transistor 100 also causes the transistor 20 to turn OFF, thereby isolating the input of the inverter 28. However, the low at the output of the inverter 28 turns ON the transistor 110, thereby coupling the supply voltage Vcc to the input of the inverter 28 to maintain its output low. Thus, the positive feedback is applied to the input of the buffer circuit 18 only between $t_3$ and $t_4$ as indicated by the label "FB" at the bottom of FIG. 4.

In summary, after each transition of the input signal, the input buffer 50 uses the input signal to generate a positive feedback signal and to generate a signal that drives the output terminal 26 to the same logic level as the input signal. Once a transition of the output signal occurs, the output signal is delayed, and the delayed transition is used to isolate the input signal from the circuitry generating the positive feedback signal and from the circuitry generating the output signal.

Figure 5:
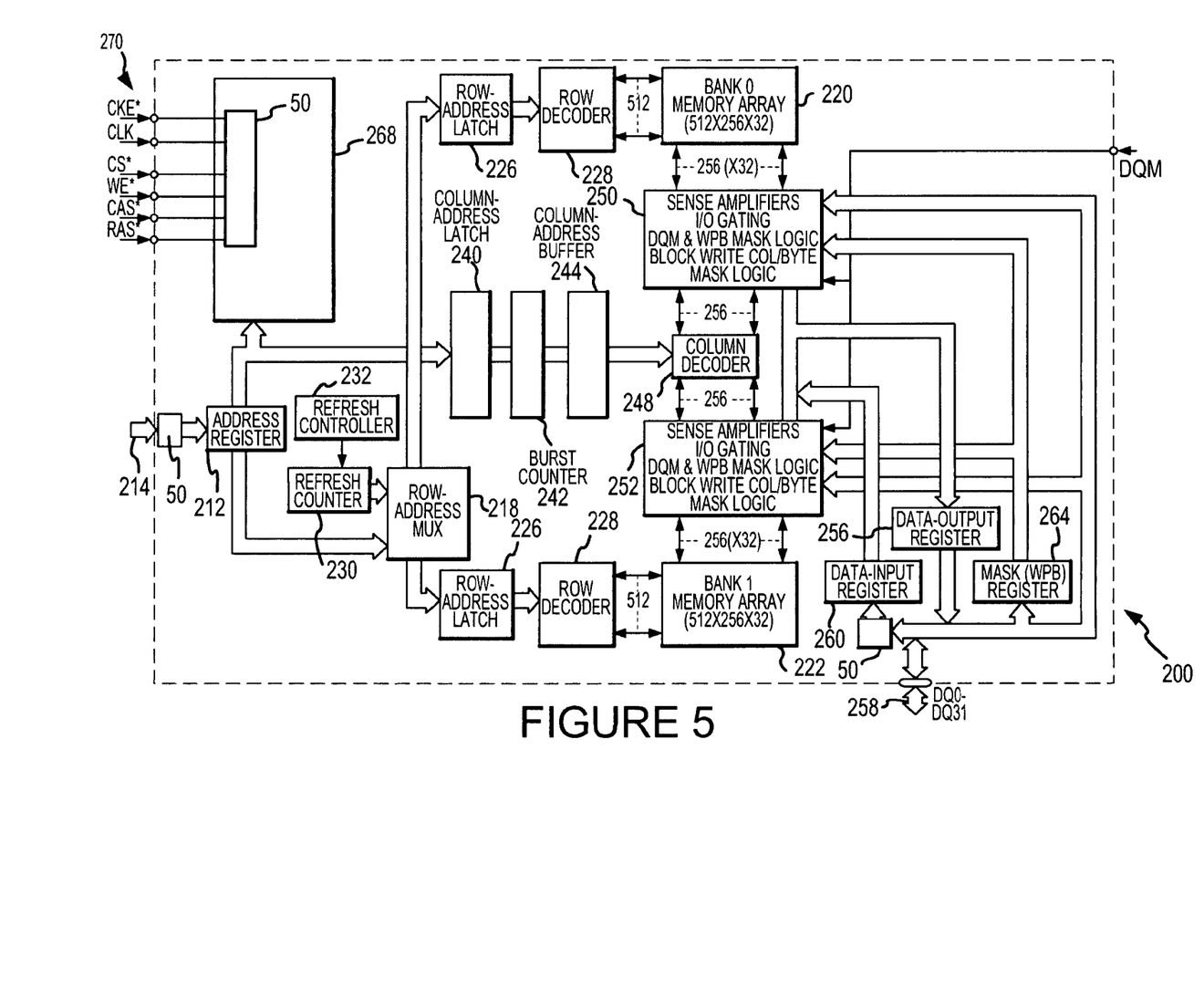
FIG. 5 is a block diagram of a memory device using input buffers according to various examples of the invention.

The input buffer 50 as well as input buffers according to other examples of the invention can be used in a wide variety of digital circuits, including a memory device as shown in FIG. 5. The memory device illustrated therein is a synchronous dynamic random access memory ("SDRAM") 200, although the invention can be embodied in other types of synchronous DRAMs, such as packetized DRAMs and RAMBUS DRAMs (RDRAMS"), as well as other types of digital devices. The SDRAM 200 includes an address register 212 that receives either a row address or a column address on an address bus 214 by coupling address signals corresponding to the addresses though input buffers 50 (FIG. 3) or though input buffers according to some other example of the invention. The address bus 214 is generally coupled to a memory controller (not shown in FIG. 5). Typically, a row address is initially received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which applies various signals to its respective array 220 or 222 as a function of the stored row address. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248 which applies various signals to respective sense amplifiers and associated column circuitry 250, 252 for the respective arrays 220, 222.

Data to be read from one of the arrays 220, 222 is coupled to the column circuitry 250, 252 for one of the arrays 220, 222, respectively. The data is then coupled through a read data path 254 to a data output register 256, which applies the data to a data bus 258. Signals corresponding to data to be written to one of the arrays 220, 222 are coupled from the data bus 258 through though input buffers 50 (FIG. 3) or though input buffers according to some other example of the invention. The input buffers 50 apply the write data signals to a data input register 260 and a write data path 262 to the column circuitry 250, 252 where the write data signals are transferred to one of the arrays 220, 222, respectively. A mask register 264 may be used to selectively alter the flow of data into and out of the column circuitry 250, 252, such as by selectively masking data to be read from the arrays 220, 222.

The above-described operation of the SDRAM 200 is controlled by a command decoder 268 responsive to command signals received on a control bus 270, again, though input buffers 50 (FIG. 3) or though input buffers according to some other example of the invention. These high level command signals, which are typically generated by a memory controller (not shown in FIG. 5), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 268 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 6:
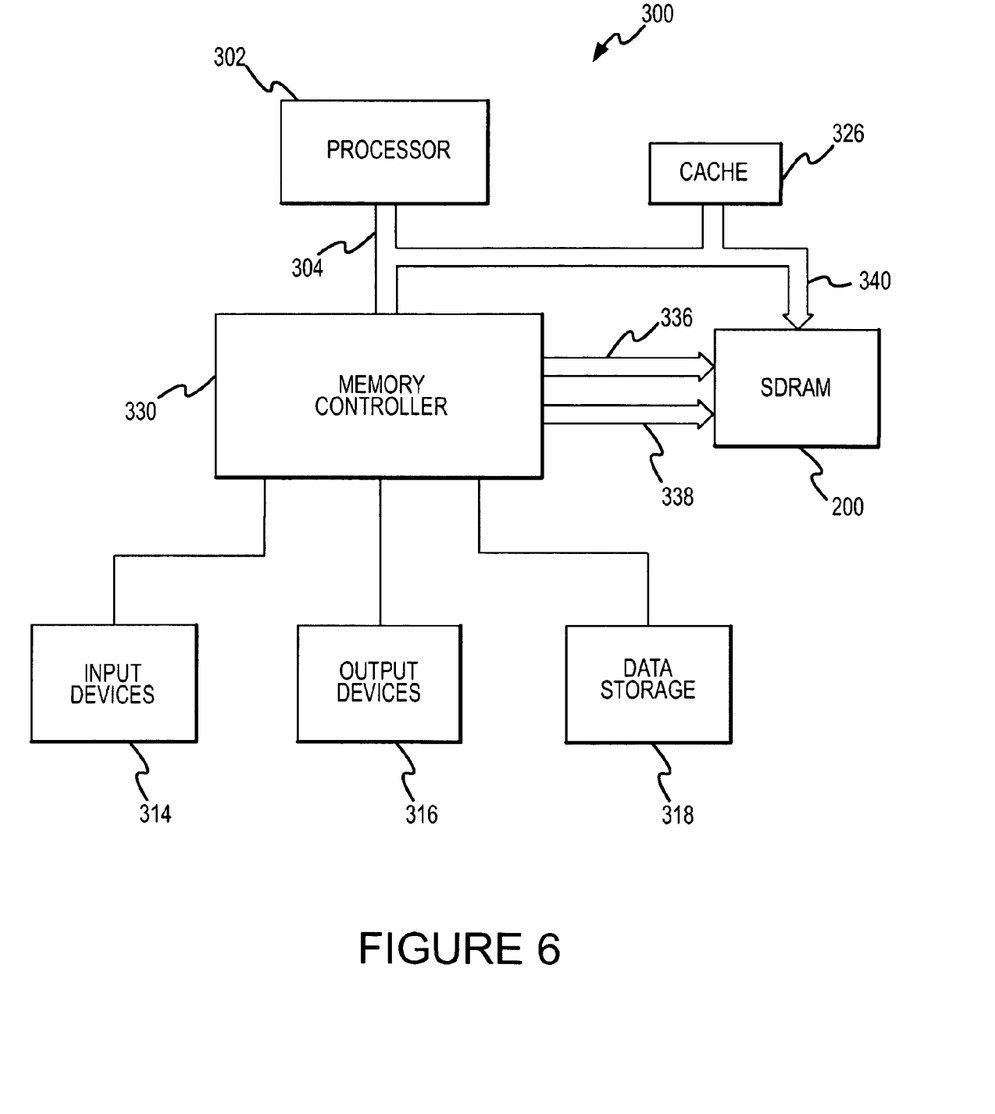
FIG. 6 is a block diagram of a processor-based system using the memory device of FIG. 5.

FIG. 6 shows a computer system 300 containing the SDRAM 200 of FIG. 5. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, it will be understood by one skilled in the art that various modifications may be made without deviating from the spirit and scope of the invention. For example, although buffer circuits 14, 18 are used as the initial buffer circuits, it will be understood that other circuits, such as inverters, may also be used. Accordingly, the invention is not limited except as by the appended claims.

What is claimed is:

1. An input buffer having a differential amplifier, and having an input terminal and an output terminal, the input buffer comprising:

a buffer circuit having an input coupled to receive an input signal from the input terminal of the input buffer, the input signal including first and second complimentary input signals and being received by the differential amplifier, the buffer circuit being operable to generate an output signal corresponding to the input signal and to couple the output signal to the output terminal of the input buffer, the buffer circuit comprising:

first and second pass gates having respective signal outputs, control inputs and signal inputs, the signal inputs being coupled to receive the input signal from the input terminal of the input buffer;

a pass gate control circuit coupled to the control inputs of the pass gates, the pass gate control circuit being coupled to receive the output signal of the buffer circuit and being operable make the first pass gate conductive and the second pass gate nonconductive responsive to an output signal having a first logic level and being operable make the first pass gate nonconductive and the second pass gate conductive and responsive to an output signal having a second logic level;

a first drive circuit having an input coupled to the output of the first pass gate, the first drive circuit being operable to drive the output signal to the second logic level responsive to the input signal coupled through the first pass gate having a corresponding logic level; and a second drive circuit having an input coupled to the output of the second pass gate, the second drive circuit being operable to drive the output signal to the first logic level responsive to the input signal coupled through the first pass gate having a corresponding logic level; and a feedback circuit having an output and an input coupled to the buffer circuit, the feedback circuit initially coupling a positive feedback signal to the buffer circuit responsive to each transition of the input signal and thereafter terminating the coupling of the positive feedback to buffer circuit before a subsequent transition of the input signal.

2. The input buffer of claim 1 wherein the buffer circuit comprises a plurality of circuit components coupled between a circuit node of the buffer circuit to which the input of the feedback circuit is coupled and a circuit node of the buffer circuit on which the output signal is generated, and wherein the feedback circuit is operable to couple the positive feedback signal to the buffer circuit responsive to each transition of the input signal at least until a transition of the output signal occurs responsive to the same transition of the input signal.

3. The input buffer of claim 2 wherein the feedback circuit is operable to couple the positive feedback signal to the buffer circuit responsive to each transition of the input signal at least until a predetermined time after a transition of the output signal occurs responsive to the same transition of the input signal.

4. The input buffer of claim 1 wherein the first logic level comprises a positive voltage, the second logic level comprises substantially zero volts, the first drive circuit comprises a PMOS transistor coupled to the output terminal of the input buffer through an inverter, and the second drive circuit comprises an NMOS transistor coupled to the output terminal of the input buffer through an inverter.

5. The input buffer of claim 4, further comprising:
a first bias circuit coupled to the output of the first pass gate and having a control input coupled to the pass gate control circuit, the first bias circuit being operable to bias the output of the first pass gate to the first logic level responsive to an output signal having the second logic level; and
a second bias circuit coupled to the output of the second pass gate and having a control input coupled to the pass gate control circuit, the second bias circuit being operable to bias the output of the second pass gate to the second logic level responsive to an output signal having the first logic level.

6. The input buffer of claim 1, wherein the feedback circuit comprises:
a first transistor having a gate coupled to the output of the first pass gate; and
a second transistor having a gate coupled to the output of the second pass gate.

7. An integrated circuit memory device, comprising:
a row address circuit operable to receive row address signals applied to an external terminal and to decode the row address signals to provide a row address;
a column address circuit operable to receive column address signals applied to an external terminal and to decode the column address signals to provide a column address;
at least one array of memory cells operable to store data written to or read from the array at a location determined by the row address and the column address;
a data path circuit operable to couple read data signals from the at least one array to an external data terminal and to couple write data signals from the external data terminal to the at least one array;
a command signal generator operable to generate a sequence of control signals corresponding to command signals applied to an external terminal; and
an input buffer coupled to at least one of the external terminals, the input buffer comprising:
a buffer circuit including a differential amplifier and having an input coupled to at least one of the external terminals to receive one of the address signals, command signals and write data signals, the signals applied to the input including first and second complementary input signals received by first and second inputs of the differential amplifier, the buffer circuit being operable to generate an output signal corresponding to the signal applied to the input of the buffer circuit and to couple the output signal to a circuit within the integrated circuit memory device, the buffer circuit comprising:
first and second pass gates having respective signal outputs, control inputs and signal inputs, the signal inputs being coupled to receive the signal applied to the input of the buffer circuit
a pass gate control circuit coupled to the control inputs of the pass gates, the pass gate control circuit being coupled to receive the output signal of the buffer circuit and being operable make the first pass gate conductive and the second pass gate nonconductive responsive to an output signal having a first logic level and being operable make the first pass gate nonconductive and the second pass gate conductive and responsive to an output signal having a second logic level;
a first drive circuit having an input coupled to the output of the first pass gate, the first drive circuit being operable to drive the output signal to the second logic level responsive to the input signal coupled through the first pass gate having a corresponding logic level; and
a second drive circuit having an input coupled to the output of the second pass gate, the second drive circuit being operable to drive the output signal to the first logic level responsive to the input signal coupled through the first pass gate having a corresponding logic level; and
a feedback circuit having an output and an input coupled to the buffer circuit, the feedback circuit initially coupling a positive feedback signal to the buffer circuit responsive to each transition of the signal applied to the input of the buffer circuit and thereafter terminating the coupling of the positive feedback to buffer circuit before a subsequent transition of the signal applied to the input of the buffer circuit.

8. The memory device of claim 7 wherein the buffer circuit comprises a plurality of circuit components coupled between a circuit node of the buffer circuit to which the input of the feedback circuit is coupled and a circuit node of the buffer circuit from which the output signal is generated, and wherein the feedback circuit is operable to couple the positive feedback signal to the buffer circuit responsive to each transition of the signal applied to the input of the buffer circuit at least until a transition of the output signal occurs responsive to the same transition of the signal applied to the input of the buffer circuit.

9. The memory device of claim 8 wherein the feedback circuit is operable to couple the positive feedback signal to the buffer circuit responsive to each transition of the signal applied to the input of the buffer circuit at least until a predetermined time after a transition of the output signal occurs responsive to the same transition of the signal applied to the input of the buffer circuit.

10. The memory device of claim 7 wherein the first logic level comprises a positive voltage, the second logic level comprises substantially zero volts, the first drive circuit comprises a PMOS transistor coupled to the circuit within the integrated circuit memory device through an inverter, and the second drive circuit comprises an NMOS transistor coupled to the circuit within the integrated circuit memory device through an inverter.

11. The memory device of claim 10, further comprising:
- a first bias circuit coupled to the output of the first pass gate and having a control input coupled to the pass gate control circuit, the first bias circuit being operable to bias the output of the first pass gate to the first logic level responsive to an output signal having the second logic level; and
- a second bias circuit coupled to the output of the second pass gate and having a control input coupled to the pass gate control circuit, the second bias circuit being operable to bias the output of the second pass gate to the second logic level responsive to an output signal having the first logic level.

12. The memory device of claim 7, wherein the feedback circuit comprises:
- a first transistor having a gate coupled to the output of the first pass gate; and
- a second transistor having a gate coupled to the output of the second pass gate.

13. A processor-based system, comprising:
- a processor having a processor bus;
- an input device coupled to the processor through the processor bus adapted to allow data to be entered into the computer system;
- an output device coupled to the processor through the processor bus adapted to allow data to be output from the computer system; and
- a memory device coupled to the processor bus adapted to allow data to be stored, the memory device comprising:
  - a row address circuit operable to receive row address signals applied to an external terminal and to decode the row address signals to provide a row address;
  - a column address circuit operable to receive column address signals applied to an external terminal and to decode the column address signals to provide a column address;
  - at least one array of memory cells operable to store data written to or read from the array at a location determined by the row address and the column address;
  - a data path circuit operable to couple read data signals from the at least one array to an external data terminal and to couple write data signals from the external data terminal to the at least one array;
  - a command signal generator operable to generate a sequence of control signals corresponding to command signals applied to an external terminal; and
  - an input buffer coupled to at least one of the external terminals, the input buffer comprising:
    - a buffer circuit including a differential amplifier and having an input coupled to at least one of the external terminals to receive one of the address signals, command signals and write data signals, the signals applied to the input including first and second complementary input signals received by first and second inputs of the differential amplifier, the buffer circuit being operable to generate an output signal corresponding to the signal applied to the input of the buffer circuit and to couple the output signal to a circuit within the memory device, the buffer circuit comprising:
      - first and second pass gates having respective signal outputs, control inputs and signal inputs, the signal inputs being coupled to receive the signal applied to the input of the buffer circuit;
      - a pass gate control circuit coupled to the control inputs of the pass gates, the pass gate control circuit being coupled to receive the output signal of the buffer circuit and being operable make the first pass gate conductive and the second pass gate nonconductive responsive to an output signal having a first logic level and being operable make the first pass gate nonconductive and the second pass gate conductive and responsive to an output signal having a second logic level;
      - a first drive circuit having an input coupled to the output of the first pass gate, the first drive circuit being operable to drive the output signal to the second logic level responsive to the input signal coupled through the first pass gate having a corresponding logic level; and
      - a second drive circuit having an input coupled to the output of the second pass gate, the second drive circuit being operable to drive the output signal to the first logic level responsive to the input signal coupled through the first pass gate having a corresponding logic level; and
      - a feedback circuit having an output and an input coupled to the buffer circuit, the feedback circuit initially coupling a positive feedback signal to the buffer circuit responsive to each transition of the signal applied to the input of the buffer circuit and thereafter terminating the coupling of the positive feedback to buffer circuit before a subsequent transition of the signal applied to the input of the buffer circuit.

14. The processor-based system of claim 13 wherein the buffer circuit comprises a plurality of circuit components coupled between a circuit node of the buffer circuit to which the input of the feedback circuit is coupled and a circuit node of the buffer circuit from which the output signal is generated, and wherein the feedback circuit is operable to couple the positive feedback signal to the buffer circuit responsive to each transition of the signal applied to the input of the buffer circuit at least until a transition of the output signal occurs responsive to the same transition of the signal applied to the input of the buffer circuit.

15. The processor-based system of claim 14 wherein the feedback circuit is operable to couple the positive feedback signal to the buffer circuit responsive to each transition of the signal applied to the input of the buffer circuit at least until a predetermined time after a transition of the output signal occurs responsive to the same transition of the signal applied to the input of the buffer circuit.

16. The processor-based system of claim 13 wherein the output signal corresponding to the signal applied to the input of the buffer circuit comprises an output signal having the same logic level as the signal applied to the input of the buffer circuit.

17. The processor-based system of claim 13 wherein the first logic level comprises a positive voltage, the second logic level comprises substantially zero volts, the first drive circuit comprises a PMOS transistor coupled to the circuit within the memory device through an inverter, and the second drive circuit comprises an NMOS transistor coupled to the circuit within the memory device through an inverter.

18. The processor-based system of claim 17, further comprising:
- a first bias circuit coupled to the output of the first pass gate and having a control input coupled to the pass gate control circuit, the first bias circuit being operable to bias the output of the first pass gate to the first logic level responsive to an output signal having the second logic level; and a second bias circuit coupled to the output of the second pass gate and having a control input coupled to the pass gate control circuit, the second bias circuit being operable to bias the output of the second pass gate to the second logic level responsive to an output signal having the first logic level.

19. The processor-based system of claim 13, wherein the feedback circuit comprises:
   a first transistor having a gate coupled to the output of the first pass gate; and
   a second transistor having a gate coupled to the output of the second pass gate.

20. An input buffer having an input terminal and an output terminal, comprising:
   a buffer circuit having an input coupled to receive an input signal from the input terminal of the input buffer, the buffer circuit being operable to generate an output signal corresponding to the input signal and to couple the output signal to the output terminal of the input buffer, the buffer circuit further comprising:
      first and second pass gates having respective signal outputs, control inputs and signal inputs, the signal inputs being coupled to receive the input signal from the input terminal of the input buffer;
      a pass gate control circuit coupled to the control inputs of the pass gates, the pass gate control circuit being coupled to receive the output signal of the buffer circuit and being operable make the first pass gate conductive and the second pass gate nonconductive responsive to an output signal having a first logic level and being operable make the first pass gate nonconductive and the second pass gate conductive and responsive to an output signal having a second logic level;
      a first drive circuit having an input coupled to the output of the first pass gate, the first drive circuit being operable to drive the output signal to the second logic level responsive to the input signal coupled through the first pass gate having a corresponding logic level; and
      a second drive circuit having an input coupled to the output of the second pass gate, the second drive circuit being operable to drive the output signal to the first logic level responsive to the input signal coupled through the first pass gate having a corresponding logic level; and
   a feedback circuit having an output and an input coupled to the buffer circuit, the feedback circuit initially coupling a positive feedback signal to the buffer circuit responsive to each transition of the input signal and thereafter terminating the coupling of the positive feedback to buffer circuit before a subsequent transition of the input signal.

21. The input buffer of claim 20 wherein the buffer circuit comprises a plurality of circuit components coupled between a circuit node of the buffer circuit to which the input of the feedback circuit is coupled and a circuit node of the buffer circuit on which the output signal is generated, and wherein the feedback circuit is operable to couple the positive feedback signal to the buffer circuit responsive to each transition of the input signal at least until a transition of the output signal occurs responsive to the same transition of the input signal.

22. The input buffer of claim 21 wherein the feedback circuit is operable to couple the positive feedback signal to the buffer circuit responsive to each transition of the input signal at least until a predetermined time after a transition of the output signal occurs responsive to the same transition of the input signal.

23. The input buffer of claim 20 wherein the first logic level comprises a positive voltage, the second logic level comprises substantially zero volts, the first drive circuit comprises a PMOS transistor coupled to the output terminal of the input buffer through an inverter, and the second drive circuit comprises an NMOS transistor coupled to the output terminal of the input buffer through an inverter.

24. The input buffer of claim 23, further comprising:
   a first bias circuit coupled to the output of the first pass gate and having a control input coupled to the pass gate control circuit, the first bias circuit being operable to bias the output of the first pass gate to the first logic level responsive to an output signal having the second logic level; and
   a second bias circuit coupled to the output of the second pass gate and having a control input coupled to the pass gate control circuit, the second bias circuit being operable to bias the output of the second pass gate to the second logic level responsive to an output signal having the first logic level.

25. The input buffer of claim 20, wherein the feedback circuit comprises:
   a first transistor having a gate coupled to the output of the first pass gate; and
   a second transistor having a gate coupled to the output of the second pass gate.

26. An integrated circuit memory device, comprising:
   a row address circuit operable to receive row address signals applied to an external terminal and to decode the row address signals to provide a row address;
   a column address circuit operable to receive column address signals applied to an external terminal and to decode the column address signals to provide a column address;
   at least one array of memory cells operable to store data written to or read from the array at a location determined by the row address and the column address;
   a data path circuit operable to couple read data signals from the at least one array to an external data terminal and to couple write data signals from the external data terminal to the at least one array;
   a command signal generator operable to generate a sequence of control signals corresponding to command signals applied to an external terminal; and
   an input buffer coupled to at least one of the external terminals, the input buffer comprising:
      a buffer circuit having an input coupled to at least one of the external terminals to receive one of the address signals, command signals and write data signals, the buffer circuit being operable to generate an output signal corresponding to the signal applied to the input of the buffer circuit and to couple the output signal to a circuit within the integrated circuit memory device, the buffer circuit further comprising:
         first and second pass gates having respective signal outputs, control inputs and signal inputs, the signal inputs being coupled to receive the signal applied to the input of the buffer circuit;
         a pass gate control circuit coupled to the control inputs of the pass gates, the pass gate control circuit being coupled to receive the output signal of the buffer circuit and being operable make the first pass gate conductive and the second pass gate nonconductive responsive to an output signal having a first logic level and being operable make the first pass gate nonconductive and the second pass gate conductive and responsive to an output signal having a second logic level;
a first drive circuit having an input coupled to the output of the first pass gate, the first drive circuit being operable to drive the output signal to the second logic level responsive to the input signal coupled through the first pass gate having a corresponding logic level; and
a second drive circuit having an input coupled to the output of the second pass gate, the second drive circuit being operable to drive the output signal to the first logic level responsive to the input signal coupled through the first pass gate having a corresponding logic level; and
a feedback circuit having an output and an input coupled to the buffer circuit, the feedback circuit initially coupling a positive feedback signal to the buffer circuit responsive to each transition of the signal applied to the input of the buffer circuit and thereafter terminating the coupling of the positive feedback to buffer circuit before a subsequent transition of the signal applied to the input of the buffer circuit.

27. The memory device of claim 26 wherein the buffer circuit comprises a plurality of circuit components coupled between a circuit node of the buffer circuit to which the input of the feedback circuit is coupled and a circuit node of the buffer circuit from which the output signal is generated, and wherein the feedback circuit is operable to couple the positive feedback signal to the buffer circuit responsive to each transition of the signal applied to the input of the buffer circuit at least until a transition of the output signal occurs responsive to the same transition of the signal applied to the input of the buffer circuit.

28. The memory device of claim 27 wherein the feedback circuit is operable to couple the positive feedback signal to the buffer circuit responsive to each transition of the signal applied to the input of the buffer circuit at least until a predetermined time after a transition of the output signal occurs responsive to the same transition of the signal applied to the input of the buffer circuit.

29. The memory device of claim 26 wherein the first logic level comprises a positive voltage, the second logic level comprises substantially zero volts, the first drive circuit comprises a PMOS transistor coupled to the circuit within the integrated circuit memory device through an inverter, and the second drive circuit comprises an NMOS transistor coupled to the circuit within the integrated circuit memory device through an inverter.

30. The memory device of claim 29, further comprising:
a first bias circuit coupled to the output of the first pass gate and having a control input coupled to the pass gate control circuit, the first bias circuit being operable to bias the output of the first pass gate to the first logic level responsive to an output signal having the second logic level; and
a second bias circuit coupled to the output of the second pass gate and having a control input coupled to the pass gate control circuit, the second bias circuit being operable to bias the output of the second pass gate to the second logic level responsive to an output signal having the first logic level.

31. The memory device of claim 26, wherein the feedback circuit comprises:
a first transistor having a gate coupled to the output of the first pass gate; and
a second transistor having a gate coupled to the output of the second pass gate.

32. A processor-based system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
a row address circuit operable to receive row address signals applied to an external terminal and to decode the row address signals to provide a row address;
a column address circuit operable to receive column address signals applied to an external terminal and to decode the column address signals to provide a column address;
at least one array of memory cells operable to store data written to or read from the array at a location determined by the row address and the column address;
a data path circuit operable to couple read data signals from the at least one array to an external data terminal and to couple write data signals from the external data terminal to the at least one array;
a command signal generator operable to generate a sequence of control signals corresponding to command signals applied to an external terminal; and
an input buffer coupled to at least one of the external terminals, the input buffer comprising:
a buffer circuit having an input coupled to at least one of the external terminals to receive one of the address signals, command signals and write data signals, the buffer circuit being operable to generate an output signal corresponding to the signal applied to the input of the buffer circuit and to couple the output signal to a circuit within the memory device, the buffer circuit further comprising:
first and second pass gates having respective signal outputs, control inputs and signal inputs, the signal inputs being coupled to receive the signal applied to the input of the buffer circuit;
a pass gate control circuit coupled to the control inputs of the pass gates, the pass gate control circuit being coupled to receive the output signal of the buffer circuit and being operable make the first pass gate conductive and the second pass gate nonconductive responsive to an output signal having a first logic level and being operable make the first pass gate nonconductive and the second pass gate conductive and responsive to an output signal having a second logic level;
a first drive circuit having an input coupled to the output of the first pass gate, the first drive circuit being operable to drive the output signal to the second logic level responsive to the input signal coupled through the first pass gate having a corresponding logic level; and
a second drive circuit having an input coupled to the output of the second pass gate, the second drive circuit being operable to drive the output signal to the first logic level responsive to the input signal coupled through the first pass gate having a corresponding logic level; and
a feedback circuit having an output and an input coupled to the buffer circuit, the feedback circuit initially coupling a positive feedback signal to the buffer circuit responsive to each transition of the signal applied to the input of the buffer circuit and thereafter terminating the coupling of the positive feedback to buffer circuit before a subsequent transition of the signal applied to the input of the buffer circuit.

33. The processor-based system of claim 32 wherein the buffer circuit comprises a plurality of circuit components coupled between a circuit node of the buffer circuit to which the input of the feedback circuit is coupled and a circuit node of the buffer circuit from which the output signal is generated, and wherein the feedback circuit is operable to couple the positive feedback signal to the buffer circuit responsive to each transition of the signal applied to the input of the buffer circuit at least until a transition of the output signal occurs responsive to the same transition of the signal applied to the input of the buffer circuit.

34. The processor-based system of claim 33 wherein the feedback circuit is operable to couple the positive feedback signal to the buffer circuit responsive to each transition of the signal applied to the input of the buffer circuit at least until a predetermined time after a transition of the output signal occurs responsive to the same transition of the signal applied to the input of the buffer circuit.

35. The processor-based system of claim 32 wherein the output signal corresponding to the signal applied to the input of the buffer circuit comprises an output signal having the same logic level as the signal applied to the input of the buffer circuit.

36. The processor-based system of claim 32 wherein the first logic level comprises a positive voltage, the second logic level comprises substantially zero volts, the first drive circuit comprises a PMOS transistor coupled to the circuit within the memory device through an inverter, and the second drive circuit comprises an NMOS transistor coupled to the circuit within the memory device through an inverter.

37. The processor-based system of claim 36, further comprising:
a first bias circuit coupled to the output of the first pass gate and having a control input coupled to the pass gate control circuit, the first bias circuit being operable to bias the output of the first pass gate to the first logic level responsive to an output signal having the second logic level; and
a second bias circuit coupled to the output of the second pass gate and having a control input coupled to the pass gate control circuit, the second bias circuit being operable to bias the output of the second pass gate to the second logic level responsive to an output signal having the first logic level.

38. The processor-based system of claim 32, wherein the feedback circuit comprises:
a first transistor having a gate coupled to the output of the first pass gate; and
a second transistor having a gate coupled to the output of the second pass gate.

* * * * *

UNITED STATES PATENT AND TRADEMARK OFFICE
CERTIFICATE OF CORRECTION

PATENT NO. : 7,512,019 B2  Page 1 of 1
APPLICATION NO. : 11/266622
DATED : March 31, 2009
INVENTOR(S) : Penney It is certified that error appears in the above-identified patent and that said Letters Patent is hereby corrected as shown below:

In column 10, line 10, in Claim 7, after "circuit" insert -- ; --.

Signed and Sealed this

Thirtieth Day of June, 2009

JOHN DOLL
*Acting Director of the United States Patent and Trademark Office*